(12) United States Patent
Kojima et al.

(10) Patent No.: US 8,545,670 B2
(45) Date of Patent: Oct. 1, 2013

(54) PLASMA PROCESSING APPARATUS AND PLASMA PROCESSING METHOD

(75) Inventors: Akihiro Kojima, Kanagawa (JP); Hisataka Hayashi, Kanagawa (JP); Akio Ui, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 904 days.

(21) Appl. No.: 12/209,617

(22) Filed: Sep. 12, 2008

(65) Prior Publication Data
US 2009/0078678 A1 Mar. 26, 2009

(30) Foreign Application Priority Data

Sep. 14, 2007 (JP) .................................. 2007-239372

(51) Int. Cl.
C23F 1/00 (2006.01)
H01L 21/306 (2006.01)
C23C 16/00 (2006.01)

(52) U.S. Cl.
USPC .................................. 156/345.44; 118/723 E

(58) Field of Classification Search
USPC .............. 156/345.43, 345.44, 345.45, 345.46, 156/345.47; 118/715, 722, 723 R, 723 E; 315/111.21
See application file for complete search history.

(56) References Cited

U.S. PATENT DOCUMENTS

| | | | |
|---|---|---|---|
| 6,089,181 A * | 7/2000 | Suemasa et al. | 118/723 E |
| 6,344,419 B1 * | 2/2002 | Forster et al. | 438/758 |
| 6,872,289 B2 * | 3/2005 | Mizuno et al. | 204/298.01 |
| 7,022,616 B2 | 4/2006 | Mimura et al. | |
| 2002/0189544 A1 * | 12/2002 | Hedberg et al. | 118/715 |
| 2004/0097079 A1 * | 5/2004 | Mimura et al. | 438/689 |
| 2004/0219797 A1 | 11/2004 | Honda et al. | |
| 2007/0065594 A1 * | 3/2007 | Chiang et al. | 427/533 |
| 2008/0057222 A1 | 3/2008 | Ui | |

FOREIGN PATENT DOCUMENTS

| | | |
|---|---|---|
| EP | 1 131 847 B1 | 2/2010 |
| JP | 9-129621 | 5/1997 |
| JP | 10-41281 | 2/1998 |
| JP | 10-204636 | 8/1998 |
| JP | 2000-269198 | 9/2000 |

(Continued)

OTHER PUBLICATIONS

Ui, A., et al., "Plasma Processing Apparatus of Substrate and Plasma Processing Method Thereof," U.S. Appl. No. 12/052,522, filed Mar. 20, 2008.

Notification of Reason(s) for Refusal issued by the Japanese Patent Office on Jun. 8, 2010, for Japanese Patent Application No. 2007-239372, and English-language translation thereof.

(Continued)

*Primary Examiner* — Maureen Gramaglia
(74) *Attorney, Agent, or Firm* — Finnegan, Henderson, Farabow, Garrett & Dunner, L.L.P.

(57) ABSTRACT

A plasma processing apparatus for processing a substrate using plasma includes a first electrode configured to mount the substrate, a second electrode disposed to face the first electrode with a predetermined space, a chamber containing the first electrode and the second electrode, the chamber being capable of adjusting an inside atmosphere, a first electric power source device configured to apply a first RF voltage for controlling a self-bias voltage generated on the substrate to the first electrode, the first electric power source device applying a substantially constant width and a substantially constant value in a peak-to-peak voltage of an RF voltage of a first frequency at intervals, and a second electric power source device configured to apply a second RF voltage of a second frequency for generating plasma between the first and second electrodes to one of the first electrode and the second electrode.

5 Claims, 7 Drawing Sheets

(56) References Cited

FOREIGN PATENT DOCUMENTS

| | | |
|---|---|---|
| JP | 2004-140391 | 5/2004 |
| JP | 2005-45291 | 2/2005 |
| JP | 2006-148156 | 6/2006 |
| JP | 2006-270019 | 10/2006 |
| JP | 2006-345001 | 12/2006 |
| WO | WO 00/26956 | 5/2000 |

OTHER PUBLICATIONS

Notification of Reason(s) for Refusal issued by the Japanese Patent Office on May 14, 2013, for Japanese Patent Application No. 2010-087032, and English-language translation thereof.
Notification of Reason(s) for Refusal issued by the Japanese Patent Office on Dec. 11, 2012, for Japanese Patent Application No. 2010-087032, and English-language translation thereof.

* cited by examiner

PLASMA PROCESSING APPARATUS AND PLASMA PROCESSING METHOD

CROSS-REFERENCE TO RELATED APPLICATION

This application is based upon and claims the benefit of priority from the prior Japanese Patent Application No. 2007-239372 filed on Sep. 14, 2007, the entire contents of which are incorporated herein by reference.

BACKGROUND OF THE INVENTION

The present invention relates to a plasma processing apparatus and a plasma processing method use in processes of manufacturing a semiconductor device and the like.

Recently, rapid progress in performance, integration and miniaturization of semiconductor devices is being achieved. For the purpose of achieving higher integration of semiconductor devices, microfabrication techniques, epitaxial growth techniques, packaging technology and the like need to be improved. Among them, microfabrication techniques have great importance. Improvement in processing accuracy such as high-aspect ratio and narrowing of the minimum line width is strongly required.

As one of such microfabrication techniques of semiconductor devices, reactive ion etching (RIE) is known. RIE allows anisotropic microfabrication processing with a high etching rate. Generally, in an RIE apparatus, a pair of electrodes are disposed facing each other with a predetermined space therebetween in a chamber where the atmosphere can be adjusted. A substrate is held onto one electrode and radio frequency (RF) electric power is supplied to the electrode to generate plasma between the electrodes.

RIE utilizes the mixture effect of physical etching (sputtering) and chemical etching. In physical etching, a potential difference between self-bias voltage generated on a substrate during generation of plasma and the potential of the plasma accelerates positive ions in the plasma. The accelerated positive ions are incident on the substrate and collide with it, so that etching proceeds. In chemical etching, etching proceeds due to active neutral radicals.

The plasma potential is relatively smaller than the self-bias voltage. Therefore, energy control of ions that are incident on the substrate is performed by controlling of the self-bias voltage.

The potential of the electrode periodically varies in accordance with the RF voltage, and therefore the ion energy also periodically varies. The ion energy distributes depending on the frequency of the RF voltage. The lower the frequency of the RF voltage is, the larger the distribution of the ion energy is.

When distribution is made in the ion energy, ions of high energy cause shoulder cutting of a pattern to degrade a processed shape. On the other hand, ions of low energy have a possibility of not contributing to processing of a substrate, or a possibility of degrading a processed shape due to deterioration of anisotropy. As disclosed in U.S. Patent Application No. 2004/0219797A1, a technique is proposed that uses RF electric power having two or more different frequencies that include RF electric power of a high frequency for generating and maintaining plasma and RF electric power of a low frequency for controlling ion energy.

In such a technique, the distribution of ion energy due to the low frequency is large. It is difficult to sufficiently narrow this distribution of ion energy to a range required for improvement in processing accuracy. Increasing the frequency of the RF electric power of the low frequency can reduce the distribution of ion energy. However, there is a problem that it becomes difficult to obtain desired ion energy.

SUMMARY

According to an aspect of the present invention, there is provided a plasma processing apparatus for processing a substrate using plasma comprises a first electrode configured to mount the substrate, a second electrode disposed to face the first electrode with a predetermined space, a chamber containing the first electrode and the second electrode, the chamber being capable of adjusting an inside atmosphere, a first electric power source device configured to apply a first RF voltage for controlling a self-bias voltage generated on the substrate to the first electrode, the first electric power source device applying a substantially constant width and a substantially constant value in a peak-to-peak voltage of an RF voltage of a first frequency at intervals, and a second electric power source device configured to apply a second RF voltage of a second frequency for generating plasma between the first and second electrodes to one of the first electrode and the second electrode.

According to an aspect of the present invention, there is provided a plasma processing apparatus for processing a substrate using plasma comprises a first electrode configured to mount the substrate, a second electrode disposed to face the first electrode with a predetermined space, a chamber containing the first electrode and the second electrode, the chamber being capable of adjusting an inside atmosphere, a first electric power source device configured to apply a DC pulse voltage of a first frequency for controlling a self-bias voltage generated on the substrate to the first electrode, and a second electric power source device configured to apply a second RF voltage of a second frequency for generating plasma between the first and second electrodes in synchronization with the DC pulse voltage to one of the first electrode and the second electrode at intervals.

According to an aspect of the present invention, there is provided a plasma processing method comprises mounting a substrate to be processed on a first electrode in a chamber being capable of adjusting an inner atmosphere, the chamber containing the first electrode and a second electrode disposed to face each other with a predetermined space in a lower portion and an upper portion of the chamber, and applying as a first RF voltage for controlling a self-bias voltage on the first electrode, a substantially constant width and a substantially constant value in a peak-to-peak voltage of an RF voltage of a first frequency at intervals to the first electrode, while applying a second RF voltage of a second frequency for generating plasma between the first electrode and the second electrode continuously or at intervals in synchronization with the voltage applied to the first electrode to one of the first electrode and the second electrode, or applying a predetermined DC pulse voltage for controlling the self-bias voltage on the first electrode to the first electrode, while applying a predetermined RF voltage for generating plasma between the first electrode and the second electrode at intervals in synchronization with the DC pulse voltage to one of the first electrode and the second electrode.

DETAILED DESCRIPTION

Figure 1:
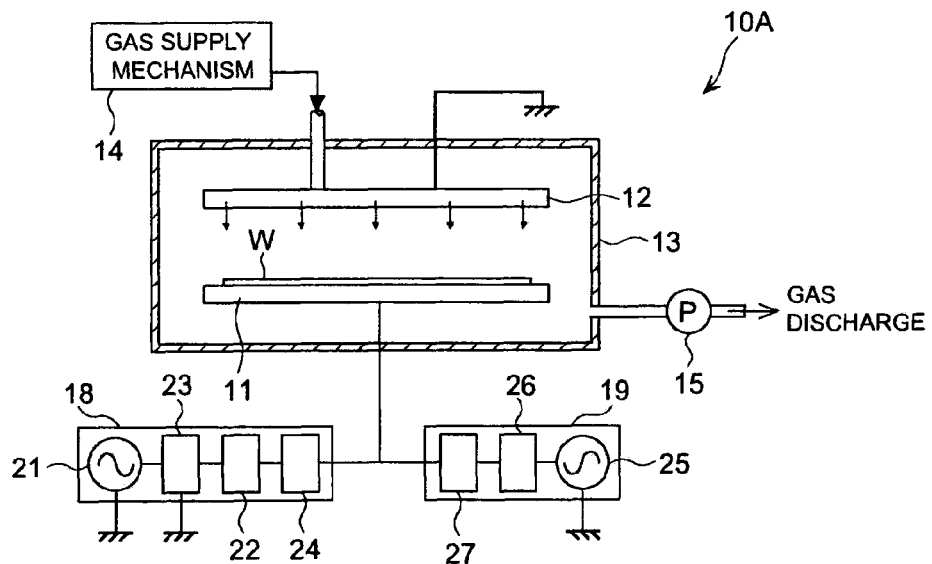
FIG. 1 is a sectional view showing the schematic configuration of an RIE apparatus according to a first embodiment of the invention.

Reference will now be made in detail to the present embodiment of the invention, an example of which is illustrated in the accompanying drawings. Wherever possible, the same reference numbers will be used throughout the drawing to refer to the same or like parts.

Herein, an RIE apparatus for plasma processing (hereinafter referred to as an "RIE apparatus") that performs an RIE process on a semiconductor substrate (hereinafter referred to as a "substrate") will be taken up as a plasma processing apparatus.

The schematic configuration of an RIE apparatus 10A according to the first embodiment of the invention is shown in FIG. 1. The RIE apparatus 10A includes a radio frequency electrode (hereinafter referred to as an "RF electrode") 11, which is a first electrode for mounting a substrate W, a counter electrode 12, which is a second electrode disposed to face the RF electrode 11 with a predetermined space therebetween, a chamber 13 that contains the RF electrode 11 and the counter electrode 12, a gas supply mechanism 14 for supplying a gas required for generating plasma to the inside of the chamber 13, and a pressure-reducing pump 15 for reducing pressure of the inside of the chamber 13.

Examples of the gas supplied from the gas supply mechanism 14 to the inside of the chamber 13 include gases such as Ar, Kr, Xe, $N_2$, $O_2$, CO and $H_2$, and in addition to these gases, process gases such as $SF_6$, $CF_4$, $C_2F_6$, $C_4F_8$, $C_5F_8$, $C_4F_6$, $Cl_2$, HBr, $SiH_4$ and $SiF_4$. The counter electrode 12 has a structure to deliver these gases to the inside of the chamber 13. By adjusting operations of the gas supply mechanism 14 and the pressure-reducing pump 15, the inside of the chamber 13 can be adjusted to a desired process atmosphere, e.g., from 1 to several Pa.

The RIE apparatus 10A includes a first electric power source device 18 and a second electric power source device 19 that apply RF voltages having different frequencies to the RF electrode 11. By these first electric power source device 18 and the second electric power source device 19, the gas supplied from the gas supply mechanism 14 to the inside of the chamber 13 is made in a plasma state between the RF electrode 11 and the counter electrode 12. An RIE process of the substrate W is performed by the gas in the plasma state.

Although the detailed structure of the RF electrode 11 is not shown in FIG. 1, the RF electrode 11 includes for example, an electrostatic chuck for attracting and holding the substrate W and a stage made of metal that supports this electrostatic chuck. RF voltage is applied to this stage. In the electrostatic chuck, a heater for maintaining the substrate W at a predetermined temperature can be buried. The counter electrode 12 is maintained at ground potential.

The first electric power source device 18 applies a voltage for controlling a self-bias voltage $V_{dc}$ on the RF electrode 11 at intervals to the RF electrode 11. The self-bias voltage $V_{dc}$ as used herein means a self-bias voltage generated on the substrate W held on the RF electrode 11.

The first electric power source device 18 includes a first RF electric power source 21 that continuously outputs an RF voltage having sine waveforms at a first frequency $f_1$, a first matching box 22 performing impedance matching for plasma loads, and a first switching unit 23 for periodically releasing toward the ground the RF voltage output from the first RF electric power source 21. The first electric power source device 18 further includes a first filter 24 for preventing the component of electric power supplied from the second electric power source device 19 to the RF electrode 11 from entering into the first matching box 22.

The second electric power source device 19 applies to the RF electrode 11 an RF voltage with the primary purpose of generating and maintaining plasma between the RF electrode 11 and the counter electrode 12. The second electric power source device 19 includes a second RF electric power source 25 that continuously outputs an RF voltage of a second frequency $f_2$, a second matching box 26, and a second filter 27 for preventing the component of electric power supplied from the first electric power source device 18 to the RF electrode 11 from entering into the second matching box 26.

The second frequency $f_2$ is preferably 50 to 200 MHz, and is set, for example, to be 100 MHz. The first frequency $f_1$ is set to be lower than the second frequency $f_2$. The first frequency $f_1$ is preferably less than 50 MHz. This is because if the first frequency $f_1$ is 50 MHz or more, ion energy is not effectively provided by control of the self-bias voltage $V_{dc}$. The first frequency $f_1$ is preferably about one third or less of the second frequency $f_2$, and may be set to be, for example, 1 MHz or 13.56 MHz. The conditions required for such setting will be described later, in detail.

Figure 2:
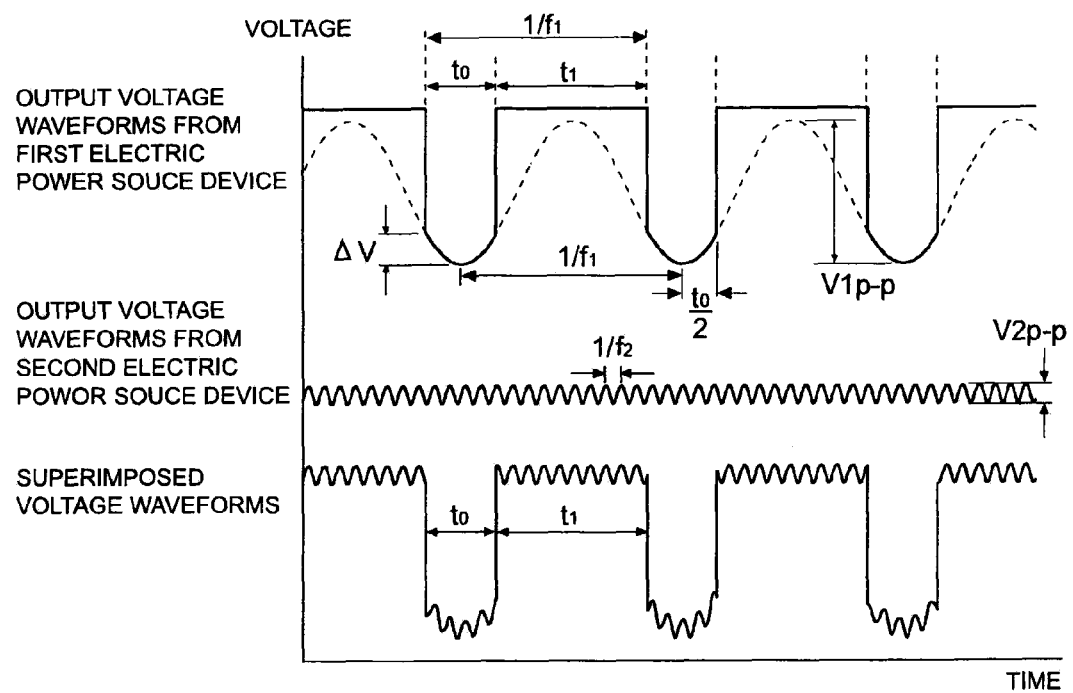
FIG. 2 shows waveforms of voltages applied to an RF electrode in the RIE apparatus according to the first embodiment.

In FIG. 2, waveforms of voltages output from the first electric power source device 18 and the second electric power source device 19 to the RF electrode 11, and superimposed voltage waveforms of these voltage waveforms are schematically shown. The first switching unit 23 performs switching operations for the RF electrode 11 so that there is a time without voltage application having a time width $t_1$ between voltage application having a time width $t_0$. That is, the first switching unit 23 makes the voltage output from the first RF electric power source 21 in a pulse manner.

The time widths $t_0$ and $t_1$ satisfy a relationship of $1/f_1 = t_0 + t_1$. Therefore, as shown in waveforms in an upper portion of FIG. 2, a substantially constant width (potential difference $\Delta V$) and a substantially constant value in a peak-to-peak voltage $V1_{P-P}$ of an RF voltage of the first frequency $f_1$ output from the first RF electric power source 21 are applied at intervals to the RF electrode 11.

The wording of "substantially constant width" and "substantially constant value" means that there may be a few variations in the width and the absolute value depending on the operation accuracy of the first switching unit 23. In their ideal states, as shown in the waveforms in the upper portion of FIG. 2, the time widths $t_0$ and $t_1$ never deviate in terms of time for the variation of the RF voltage. Accordingly, the width of the potential difference $\Delta V$ does not vary and the absolute value of the applied voltage is maintained within certain values. Hereinafter, a voltage output from the first electric power source device 18 is referred to as a "pulse voltage of the first frequency $f_1$".

The pulse voltage of the first frequency $f_1$ varies in a negative voltage value region due to a negative self-bias voltage. If the pulse voltage of the first frequency $f_1$ is positive, the absolute value of the self-bias voltage $V_{dc}$ becomes small. The pulse voltage of the first frequency $f_1$ should thus be set as a negative pulse voltage.

The RF voltage of the second frequency $f_2$ is continuously output from the second electric power source device 19 as shown in the voltage waveforms in a middle portion of FIG. 2. The peak-to-peak voltage $V1_{P-P}$ of the RF voltage output from the first RF electric power source 21 is several hundred volts. On the other hand, a peak-to-peak voltage $V2_{P-P}$ of the RF voltage output from the second RF electric power source 25 is several ten volts. Both the peak-to-peak voltages $V1_{P-P}$ and $V2_{P-P}$ are negative. When the pulse voltage of the first frequency $f_1$ output from the first electric power source device 18 and the RF voltage of the second frequency $f_2$ output from the second electric power source device 19 are superimposed on each other, voltage waveforms as shown in a lower portion of FIG. 2 are obtained.

Figure 3:
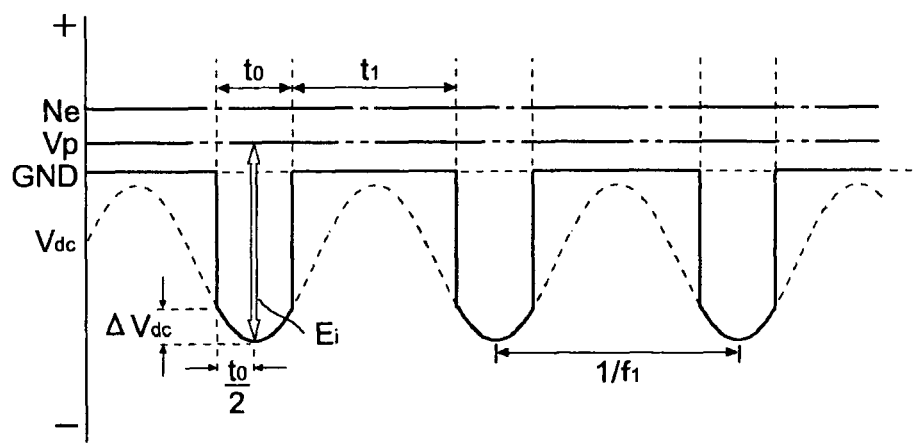
FIG. 3 schematically shows a relationship among the plasma electron density, the plasma potential and the self-bias voltage with the RIE apparatus according to the first embodiment.

The relationship among an electron density $N_e$ of plasma generated between the RF electrode 11 and the counter electrode 12 by applying the superimposed voltage shown in the lower portion of FIG. 2 to the RF electrode 11, a plasma potential $V_p$ and the self-bias voltage $V_{dc}$ is shown in FIG. 3.

The plasma electron density $N_e$ is maintained at an approximately constant value. This is because this density depends on the RF electric power component of the second frequency $f_2$ applied from the second electric power source device 19 to the RF electrode 11. Accordingly, the positive ion density in the plasma is held constant (not shown), and the plasma potential $V_p$ is also held constant.

The self-bias voltage $V_{dc}$ substantially varies in a range of negative voltage value in accordance with the variation of the pulse voltage of the first frequency $f_1$. Contribution of the RF voltage of the second frequency $f_2$ can be ignored. Since the self-bias voltage $V_{dc}$ is at negative potential and the plasma potential $V_p$ is at positive potential, ion energy $E_i$ of positive ions in the plasma is represented as a difference between the self-bias voltage $V_{dc}$ and the plasma potential $V_p$ (i.e., the sum of absolute values). The plasma potential $V_p$ is extremely smaller than the self-bias voltage $V_{dc}$, and therefore the self-bias voltage $V_{dc}$ can be considered to be substantially the ion energy $E_i$.

Applying a small amount of electric power to the RF electrode 11 allows positive ions in the plasma to have energy required for RIE processing. As shown in FIG. 3, the self-bias voltage $V_{dc}$ is generated to have a large absolute value to accelerate positive ions in the plasma, so that the positive ions can be drawn into the substrate W. At this point, as shown in the upper portion of FIG. 2 referred to above, used is the pulse voltage of the first frequency $f_1$ for which the time widths $t_0$ and $t_1$ are set such that the RF voltage with sine waveforms at the first frequency $f_1$ has the minimum value at the center ($=t_0/2$) of the time width $t_0$.

Due to the potential difference $\Delta V$ in the pulse voltage of the first frequency $f_1$, the potential difference $\Delta V_{dc}$ is generated in the self-bias voltage $V_{dc}$. The potential difference $\Delta V_{dc}$ is one factor of increasing the diffusion (diffusion width) of the ion energy $E_i$. By setting the time widths $t_0$ and $t_1$ such that the RF voltage with sine waveforms at the first frequency $f_1$ has the minimum value at the center ($=t_0/2$) of the time width $t_0$, as shown in FIG. 2, the potential difference $\Delta V$ with respect to the time width $t_0$ can be made the smallest. This enables the potential difference $\Delta_{dc}$ to be reduced to a small value. In order to narrow the distribution of the ion energy $E_i$, it is desirable that the time width to be one fourth or less of the period of the first frequency $f_1$ ($=1/f_1$).

The distribution of the ion energy $E_i$ depends on whether positive ions in the plasma can follow the electrode potential of the RF electrode 11 or not. Positive ions in the plasma follow the electrode potential of the RF electrode 11 when the frequency of the electrode potential of the RF electrode 11 is less than or equal to the ion frequency $\omega_{pi}$ of the plasma. Here, the ion frequency $\omega_{pi}$ is given by $\omega_{pi} = (e^2 Ni/(\epsilon_0 M))^{1/2}$ [Hz], where Ni: ion density (ions/m$^3$), $\epsilon_0$: dielectric constant of vacuum, M: mass of the ion (kg), and e: elementary charge.

The frequency of the electrode potential of the RF electrode 11 is the same as the first frequency $f_1$. When the first frequency $f_1$ is less than or equal to the ion frequency $\omega_{pi}$, positive ions in the plasma have ion energy following the electrode potential of the RF electrode 11. The self-bias voltage $V_{dc}$ of FIG. 3 indicates the value reflecting the ion energy.

Figure 4:
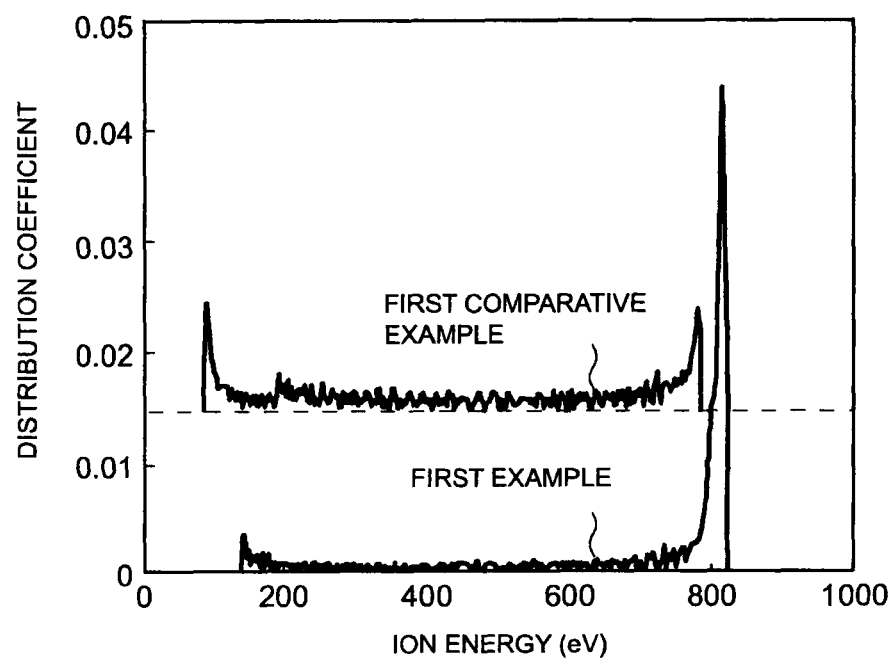
FIG. 4 is a graph showing simulation results of ion energies and their distributions when ions follow the electrode potential.

As a first comparative example, performed is a simulation of the distribution of ion energy when the RF voltage of the first frequency $f_1$ ($=1$ MHz) and the RF voltage of the second frequency $f_2$ ($=100$ MHz) are continuously applied in a superimposed manner to the RF electrode 11 using an RIE apparatus obtained by removing the first switching unit 23 from the RIE apparatus 10A. The result of the simulation is schematically shown in FIG. 4. For the simulation, the continuum model plasma simulator (G. Chen, L. L. Raja, J. Appl. Phys., 96, 6073 (2004)) is used.

As a first example, a simulation of the distribution of ion energy when the pulse voltage (time width $t_0 = \frac{1}{4} f_1$) of the first frequency $f_1$ ($=1$ MHz) and the continuous RF voltage of the second frequency $f_2$ ($=100$ MHz) are applied in a superimposed manner to the RF electrode 11 using the RIE apparatus 10A is performed in the same way as in the first comparative example. The result of simulation is schematically shown, together with the foregoing result, in FIG. 4.

Specifically, both in the first comparative example and the first example, the distance between the RF electrode and the counter electrode is 30 mm, the substrate size is $\phi$300 mm, the argon (Ar) gas flow rate is 200 sccm, the chamber pressure is 1.333 Pa ($=10$ mTorr). Regarding the RF voltage of the first frequency $f_1$ ($=1$ MHz), $V_{p-p} = 900$ V and the electric power is 400 W, and the RF voltage of the second frequency $f_2$ ($=100$ MHz) is $V_{p-p} = 20$ V, and the electric power is 500 W. Note that in FIG. 4, ion energy distributions of the first comparative example and that of the first example are illustrated with the base lines vertically shifted.

If the electrode potential of the RF electrode 11 varies at a frequency of 1 MHz, positive ions in the plasma using various gases mentioned above follow the electrode potential. In the first comparative example, ion energy in the plasma is divided into a peak on the low energy side and a peak on the high energy side, and the energy difference is about 700 eV. There is a certain percentage of ions having energy between those of these two peaks.

In contrast, in the first example, the energy difference between the peak on the low energy side and the peak on the high energy side is the same as that in the first comparative example. The peak on the high energy side is extremely large while having a narrow peak width. It is found that there is an extremely large percentage of ions having energy of the peak on the high energy side. The percentage of this peak on the high energy side to the whole reaches about 80%.

Accordingly, by setting the position of the peak on the high energy side in an appropriate energy range to substantially use only the peak on the high energy side, an RIE process of the substrate W is performed, thereby enabling the processed shape to be accurately controlled. The value of the peak on the high energy side can be controlled by controlling the value of the pulse voltage of the first frequency $f_1$.

On the other hand, if the frequency of the electrode potential of the RF electrode 11 is over the ion frequency $\omega_{pi}$ of the plasma, positive ions in the plasma cannot follow the electrode potential. In this case, ion energy, i.e., the self-bias voltage $V_{dc}$ varies with amplitude smaller than the value of the pulse voltage of the first frequency $f_1$.

As a second comparative example, performed is a simulation of the distribution of ion energy when the RF voltage of the first frequency $f_1$ (=13.56 MHz) being over the ion frequency $\omega_{pi}$ of the plasma and the RF voltage of the second frequency $f_2$ (=100 MHz) are continuously applied in a superimposed manner to the RF electrode 11 using an RIE apparatus having the same configuration as that in the first comparative example. The result of the simulation is schematically shown in FIG. 5.

As a second example, a simulation of the distribution of ion energy when the pulse voltage (time width $t_0 = \frac{1}{4} f_1$) of the first frequency $f_1$ (=13.56 MHz) and the continuous RF voltage of the second frequency $f_2$ (=100 MHz) are applied in a superimposed manner to the RF electrode 11 using the RIE apparatus 10A is performed in the same way as in the first comparative example. The result of simulation is schematically shown, together with the foregoing result, in FIG. 5.

Specifically, the distance between the RF electrode and the counter electrode is 30 mm, the substrate size is φ300 mm, the argon (Ar) gas flow rate is 200 sccm, the chamber pressure is 1.333 Pa (=10 mTorr). Regarding the RF voltage of the first frequency $f_1$ (=13.56 MHz), $V_{p-p}$=900 V and the electric power is 400 W, and regarding the RF voltage of the second frequency $f_2$ (=100 MHz), $V_{p-p}$=20 V and the electric power is 500 W.

Figure 5:
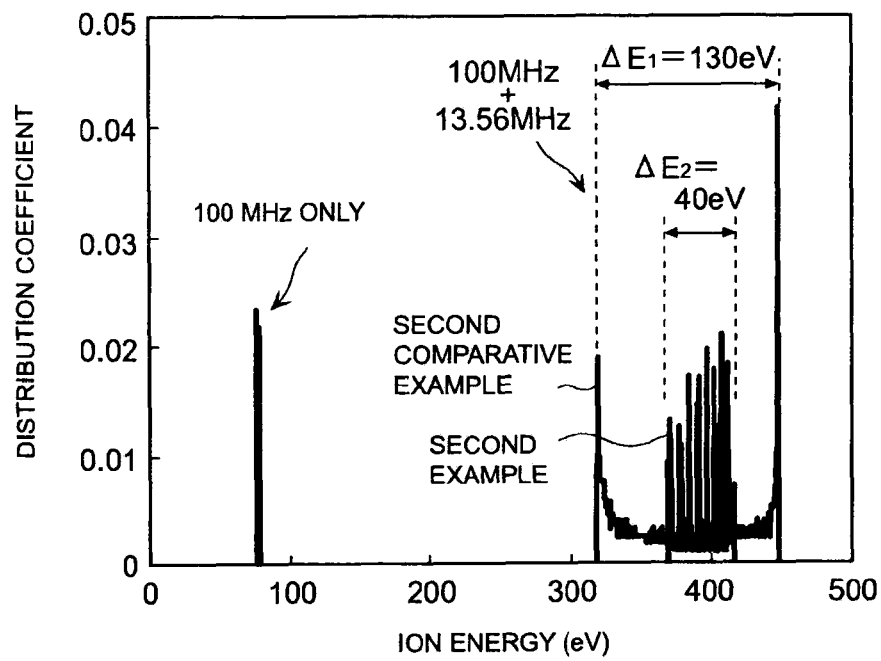
FIG. 5 is a graph showing simulation results of ion energies and their distributions when ions do not follow the electrode potential.

Further, ion energy when only the RF voltage of 100 MHz is continuously applied at the same voltage and the same electric power as those in the second example to the RF electrode 11 is shown together in FIG. 5.

Positive ions in the plasma using various gases mentioned above cannot follow the electrode potential of the RF electrode 11 if this electrode potential varies at a frequency of 13.56 MHz.

In the second comparative example, the self-bias voltage $V_{dc}$ of −350 V is generated. The ion energy is 320 to 450 eV, and a distribution $\Delta E_1$ of ion energy is 130 eV. In this case, a part of positive ions has energy outside the energy range suitable for RIE processing.

In contrast, in the second example, the self-bias voltage $V_{dc}$ of −350 V is generated as in the second comparative example. Since positive ions cannot follow the pulse voltage of the first frequency $f_1$, the peak on the low energy side and the peak on the high energy side become close. A distribution $\Delta E_2$ of ion energy is 40 eV, which is narrowed to about one third of the distribution in the second comparative example. The ion energy of substantially all positive ions can be included in the energy range suitable for RIE processing.

The ion energy when only the RF voltage of the second frequency $f_2$ (=100 MHz) is applied to the RF electrode 11 is about 75 eV, and positive ions having this ion energy do not contribute to RIE processing.

Comparing the first example with the second example, many ions concentrate upon high energy portions by narrowing the range of ion energy in the first example. However, a certain amount of ions have energy lower than that of those ions, and their distribution range is wide. There may be possibilities for such low-energy ions to degrade the processed shape or to make it difficult to increase the etching rate.

In contrast, in the second example, the distribution of ion energy can be narrowed so that substantially all positive ions in the plasma have ion energy suitable for RIE processing. Thus, a high etching rate and processing with high accuracy can be concurrently achieved.

More detailed description will be given on effects of such narrowing of the range of ion energy on RIE processing. Either of the foregoing first and second examples may be used here, but the second example is preferably used.

Figure 6A:
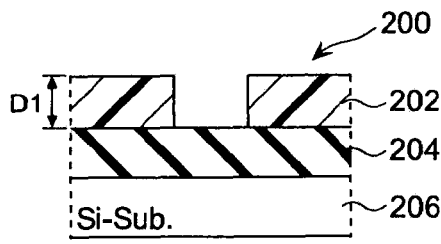
FIGS. 6A to 6C are schematic sectional views showing the structure of an object to be processed.
Figure 6B:
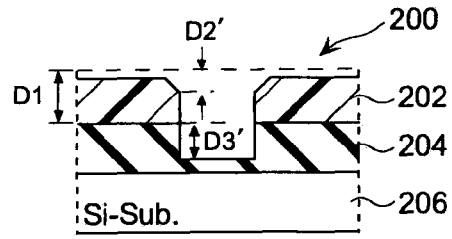
Figure 6C:
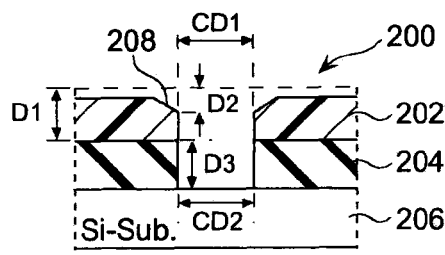

FIGS. 6A to 6C, schematic sectional views are the structure of an object 200 to be processed. FIG. 6A is a sectional view before the RIE process, FIG. 6B is a sectional view during the RIE process, and FIG. 6C is a sectional view after completion of the RIE process.

The object 200 to be processed before the RIE process has a configuration in which a mask layer 202, which has been patterned in advance, for example, by a lithography step, and a layer 204 to be etched positioned therebelow are formed, for example, on the top of a silicon substrate 206. For the mask layer 202, for example, an X-ray resist or an excimer laser resist is used. The layer 204 to be etched is, for example, a silicon oxide film, and may be a silicon oxide film with boron or phosphorus added thereto. A film made of another material may be formed between the mask layer 202 and the layer 204 to be etched.

An etching process according to the foregoing second example is applied to the object 200 to be processed as mentioned above. As shown in FIG. 6C, using a hole diameter CD1 (hereinafter also referred to as a "top CD") of the mask layer 202, a hole having a bottom diameter CD2 (hereinafter also referred to as a "bottom CD") and a depth D3 from the surface of the layer 204 to be etched is formed. At this point, in the mask layer 202, a shoulder 208 around the hole entrance is cut to a depth D2 from the original surface. Note that as shown in FIG. 6B, the depth of the hole from the layer 204 to be etched during etching is D3' and the depth of the shoulder 208 cut from the original surface is D2'.

For example, an RIE process is performed on an object to be processed that includes the layer 204 to be etched being a silicon oxide film formed on a silicon substrate of φ300 mm by thermal oxidation and the mask layer 202 being an X-ray resist and in which a hole pattern having a predetermined diameter is formed.

The RIE conditions are that the flow rates of $C_4F_6$ gas/Ar gas/$O_2$ gas are set to a predetermined ratio (e.g., $C_4F_6$:Ar:$O_2$=18:400:10 (sccm)), the pressure in the chamber 13 is 2.667 Pa (=20 mTorr), the applied electric power at 100 MHz is 500 W and the applied electric power at 13.56 MHz is 400 W. An RF voltage of 13.56 MHz has become voltage in a pulse manner in the same mode as that in the second example. The distance between the counter electrode 12 and the surface of a silicon substrate being the object to be processed is set to be 27 mm, and the temperature of the RF electrode 11 is set to be 20° C.

Etching selectivity means a ratio of the etching rate of the layer 204 to be etched to that of the mask layer 202, and therefore is represented as D3'/D2' using parameters shown in FIG. 6B. Bottom CD/top CD means one of values representing the hole shape, and is expressed as CD2/CD1 when using parameters shown in FIG. 6C.

If the etching selectivity is low, etching even with a high etching rate leads to a risk of destroying the mask layer 202 until a desired depth of a hole is secured. Therefore, in order to perform an etching process without destroying the mask layer 202 during forming of a deep hole, high etching selectivity is required. The bottom CD/top CD being high means that a hole having a sufficient size of the bottom surface for the size of the opening is formed, and is preferable.

In an RIE process using a mode according to the second example, narrowing the range of ion energy makes it easy to set conditions of the RIE process such that the RIE process has an appropriate etching performance for the layer 204 to be etched and a low etching rate for the mask layer 202. It is possible to set the etching selectivity D3'/D2' to be high to achieve a high value of the bottom CD/top CD.

Figure 7:
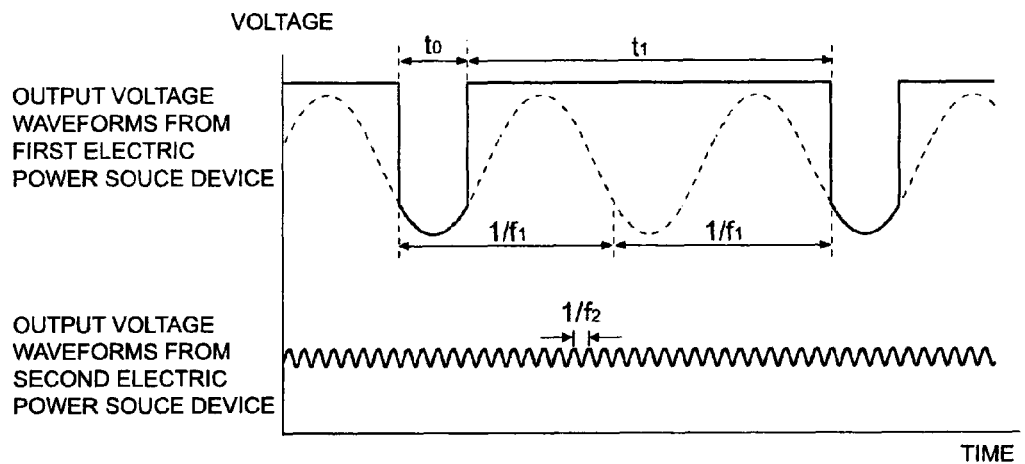
FIG. 7 shows waveforms of other voltages applied to the RF electrode in the RIE apparatus according to the first embodiment.

In the RIE apparatus 10A, application of pulse voltage to the RF electrode 11 by the first electric power source device 18 is not limited to a mode shown in FIG. 3. The application may be in a mode where voltage in a pulse manner in a period of a natural number of times as long as a period ($1/f_1$) of output voltage from the first RF electric power source 21. As an example, a mode of applying a pulse voltage of the frequency to the RF electrode 11 in a period of $2/f_1$, which is twice the period of the output voltage from the first RF electric power source 21, is shown in FIG. 7. In FIG. 7, the relationship of $t_0+t_1=2/f_1$ is satisfied.

In this case, the substantial frequency in application of the pulse voltage to the RF electrode 11 is $f_1/2$. If the relationship of $f_1/2 > \omega_{pi}$ is satisfied, narrowing the range of ion energy is achieved in the same mode as that in the aforementioned second example. If the relationship of $f_1/2 \leq \omega_{pi}$ is satisfied, narrowing the range of ion energy is achieved in the same mode as that in the aforementioned first example.

Figure 8:
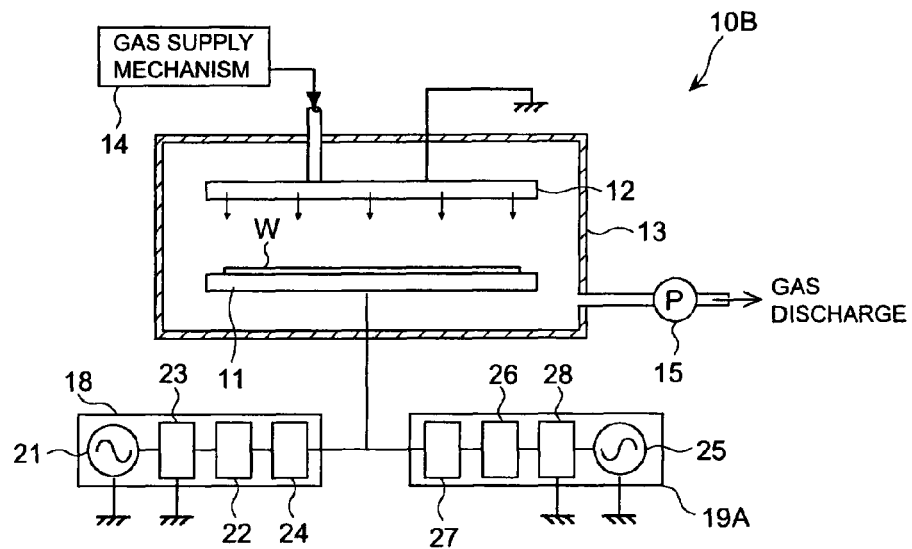
FIG. 8 shows the schematic configuration of an RIE apparatus according to a second embodiment of the invention.

An RIE apparatus according to the second embodiment of the invention will be described below. In FIG. 8, a sectional view showing the schematic configuration of a RIE apparatus 10B is given. The RIE apparatus 10B differs from the RIE apparatus 10A in that the second electric power source device 19A includes a second switching unit 28 for periodically releasing toward the ground the RF voltage output from the second RF electric power source 25.

Figure 9:
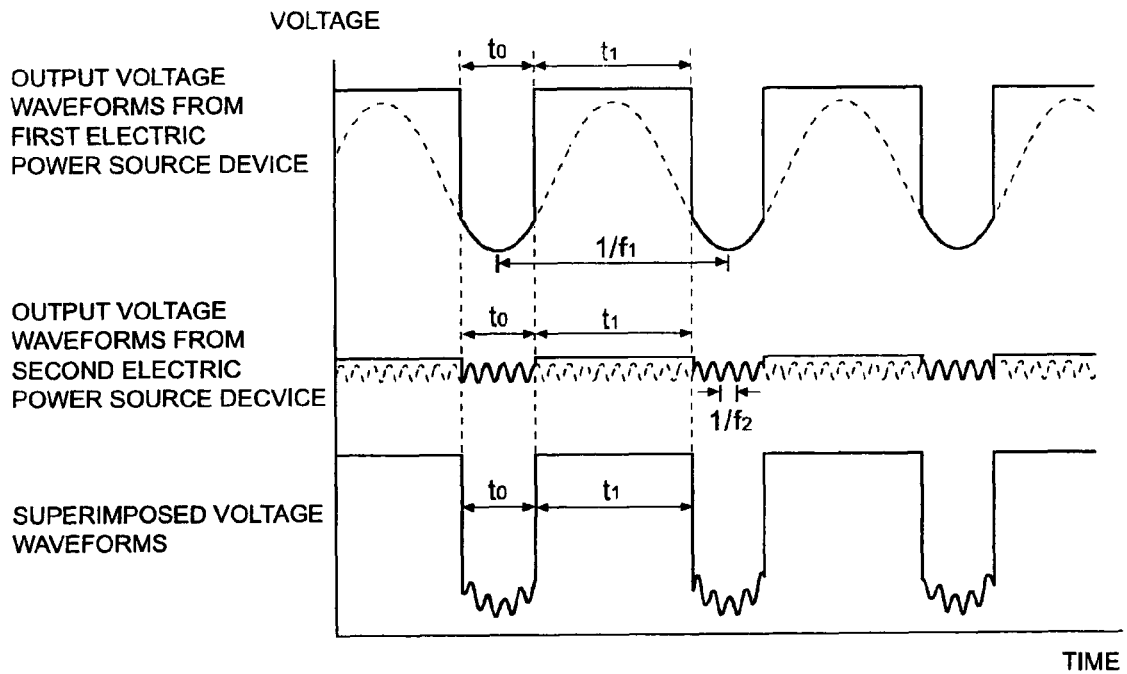
FIG. 9 shows waveforms of voltages applied to an RF electrode in the RIE apparatus according to the second embodiment.

Shown in FIG. 9 are waveforms of voltages output from the first electric power source device 18 and the second electric power source device 19A to the RF electrode 11 and superimposed voltage waveforms. Output from the first electric power source device 18 is the same pulse voltage of the first frequency $f_1$ as shown in FIG. 2 referred to above (in an upper portion of FIG. 9). The second switching unit 28 performs switching operations so that a time without voltage application having a time width $t_1$ exists between voltage application having a time width $t_0$ in synchronization with the pulse voltage of the first frequency $f_1$ output from the first electric power source device 18. Output from the second electric power source device 19A is a pulse voltage of the second frequency $f_2$ (in a middle portion of FIG. 9). By superimposing these waveforms on each other, superimposed waveforms shown in a lower portion of FIG. 9 are obtained.

Figure 10:
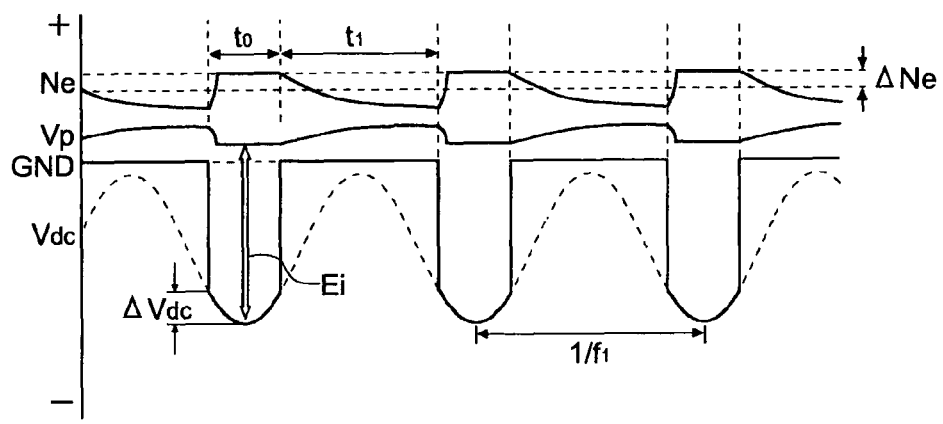
FIG. 10 schematically shows a relationship among the plasma electron density, the plasma potential and the self-bias voltage with the RIE apparatus according to the second embodiment.

The relationship among the electron density $N_e$ of plasma generated between the RF electrode 11 and the counter electrode 12 upon application of the superimposed voltage shown in the lower portion of FIG. 9 to the RF electrode 11, the plasma potential $V_p$ and the self-bias voltage $V_{dc}$ is schematically shown in FIG. 10.

The plasma electron density $N_e$ depends on the RF electric power component of the second frequency $f_2$ applied from the second electric power source device 19A to the RF electrode 11. The RF electric power component of the second frequency $f_2$ is applied at intervals, and the voltage application to the RF electrode 11 is turned off, thereby decreasing the electron density $N_e$. The density of positive ions in the plasma also decreases with a decrease of the electron density $N_e$ (not shown). This is because supplying of energy to maintain the plasma is stopped. On the other hand, the voltage application to the RF electrode 11 is turned on, thereby returning the electron density $N_e$, the positive ion density and the plasma potential $V_p$ to their constant values.

Recently, increased discharge frequency (the second frequency $f_2$) has achieved stable generation of plasma. On the other hand, dissociation of process gases proceeds more than required due to increased density of plasma. Active species (positive ions) are excessively supplied, causing problems such as deformation of a mask and insufficient selectivity.

By applying the RF electric power of the second frequency $f_2$ at intervals by the second electric power source device 19A, generation of active species due to excessive dissociation of process gases can be suppressed. Suppressing generation of active species can prevent mask deformation and improve selectivity.

As the electron density $N_e$ decreases by application of the RF electric power of the second frequency $f_2$ to the RF electrode 11 at intervals, the plasma potential $V_p$ increases. This variation of the plasma potential $V_p$ is extremely smaller than the self-bias voltage $V_{dc}$, and therefore does not substantially affect the ion energy $E_i$. In the RIE apparatus 10B, by the use of the pulse voltage of the first frequency $f_1$, the same effect as narrowing the range of ion energy in the first and second examples using the RIE apparatus 10A can be obtained.

Figure 11:
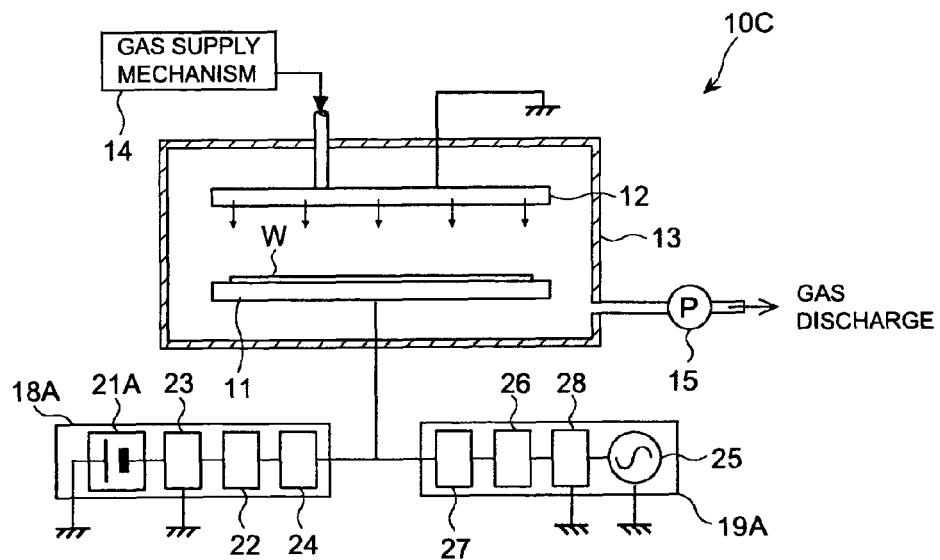
FIG. 11 shows the schematic configuration of an RIE apparatus according to a third embodiment of the invention.

An RIE apparatus according to the third embodiment of the invention will be described below. In FIG. 11, a sectional view showing the schematic configuration of an RIE apparatus 10C is given. The RIE apparatus 10C differs from the RIE apparatus 10B in that the first electric power source device 18A includes a direct current (DC) electric power source 21A instead of the first RF electric power source 21.

Figure 12:
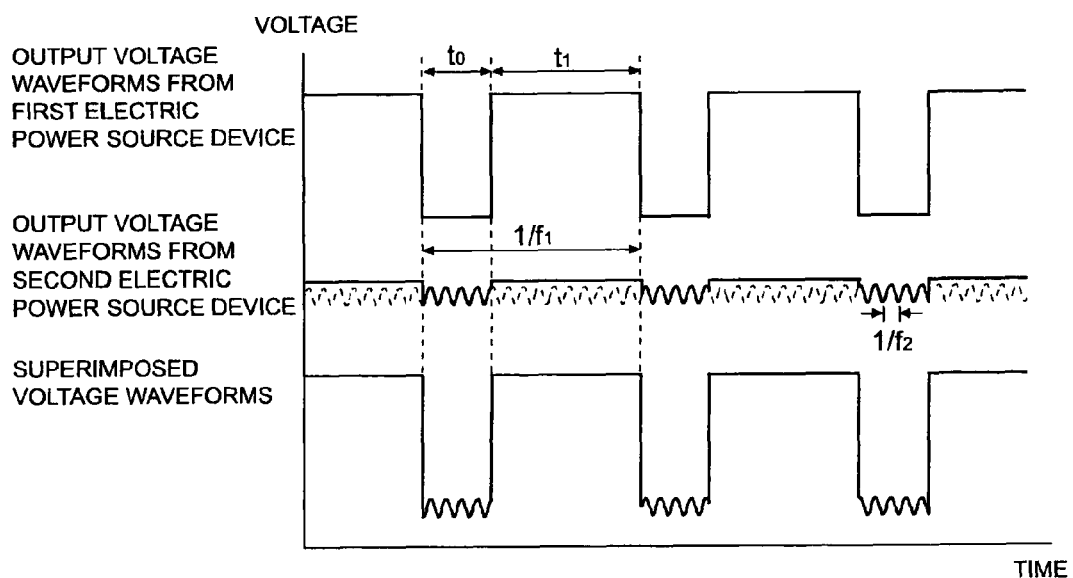
FIG. 12 shows waveforms of voltages applied to an RF electrode in the RIE apparatus according to the third embodiment.

Shown in FIG. 12 are waveforms of voltages output from the first electric power source device 18A and the second electric power source device 19A to the RF electrode 11 and superimposed voltage waveforms. Output from the first electric power source device 18A is a DC pulse voltage having a pulse period of $1/f_1$ in which a time without voltage application having a time width $t_1$ exists between DC voltage application having a time width $t_0$ (in an upper portion of FIG. 12). Output from the second electric power source device 19A is a pulse voltage of the second frequency $f_2$ so that a time without voltage application having the time width $t_1$ is provided between voltage application having the time width $t_0$ in synchronization with the DC pulse voltage of the first frequency $f_1$ output from the first electric power source device 18A (in a middle portion of FIG. 12). By superimposing these waveforms on each other, superimposed waveforms shown in a lower portion of FIG. 12 are obtained.

In the RIE apparatuses 10A and 10B, since an alternating current (AC) electric power source is used as the first RF electric power source 21, the potential difference ΔV is inevitably generated when the time width $t_0$ for voltage application is determined. In contrast, in the case of use of the DC electric power source 21A, the potential difference ΔV is ideally not generated. The effects of narrowing the range of ion energy therefore become larger.

In reality, however, the potential difference ΔV is caused by the gradient of fall/rise of the DC pulse voltage. At both edges of a pulse, voltage does not vary at 90° as shown in FIG. 12 and there is certain curvature. It is therefore difficult to completely eliminate ΔV. However, when a DC electric power source is used, the potential difference ΔV can be reduced to be smaller than when the AC electric power source is used. The potential difference $\Delta V_{dc}$ of the self-bias voltage $V_{dc}$ can also be reduced to be small.

Figure 13:
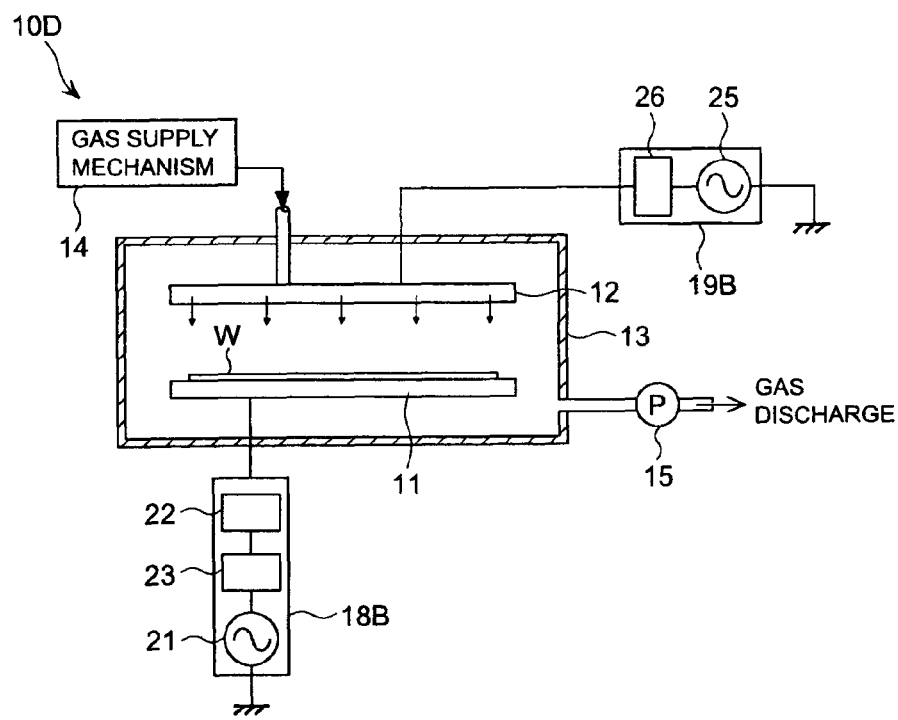
FIG. 13 shows the schematic configuration of a modification of the RIE apparatus according to the first embodiment.

While the embodiments of invention have been described above, the invention is not limited to the foregoing embodiments. For example, the RIE apparatus 10A is not limited to the configuration in which voltages output from the first electric power source device 18 and the second electric power source device 19 are applied in a superimposed manner to the RF electrode 11. The RIE apparatus 10A may have a configuration as that of an RIE apparatus 10D shown in FIG. 13. As shown in FIG. 13, a first electric power source device 18B, which is a new device obtained by removing the first filter 24 from the first electric power source device 18, is connected to the RF electrode 11. A second electric power source device 19B, which is a new device obtained by removing the second filter 27 from the second electric power source device 19, is connected to the counter electrode 12. With such a configuration, output from the first electric power source device 18B and the second electric power source device 19B can be in the same mode as that shown in FIG. 2.

There is no difference in the effects of the RIE process between the RIE apparatus 10D and the RIE apparatus 10A. The RIE apparatus 10D does not require the first filter 24 and the second filter 27, and therefore has a simple device configuration. Similar modifications may be made for the RIE apparatuses 10B and 10C.

In the RIE apparatus 10B, like in the RIE apparatus 10A, the application may be in a mode where voltage in a pulse manner in a period of a natural number of times as long as that of output voltage from the first RF electric power source 21. Just as shown in FIG. 7, a pulse voltage of the first frequency can be applied to the RF electrode 11 in a period of $2/f_1$ being twice the period of the output voltage from the first RF electric power source 21. It is preferable that the second electric power source device 19 applies a voltage for maintaining plasma and the like in a pulse manner obtained from output from the first RF electric power source 21 in synchronization with a period ($2/f_1$) being twice the period of the output voltage from the first RF electric power source 21. At this point, the second electric power source device 19 need not be completely in synchronization with the period, and should not be in OFF state when first electric power source device 18 is in ON state. For the RIE apparatus 10D, similar modifications may be made.

Figure 14:
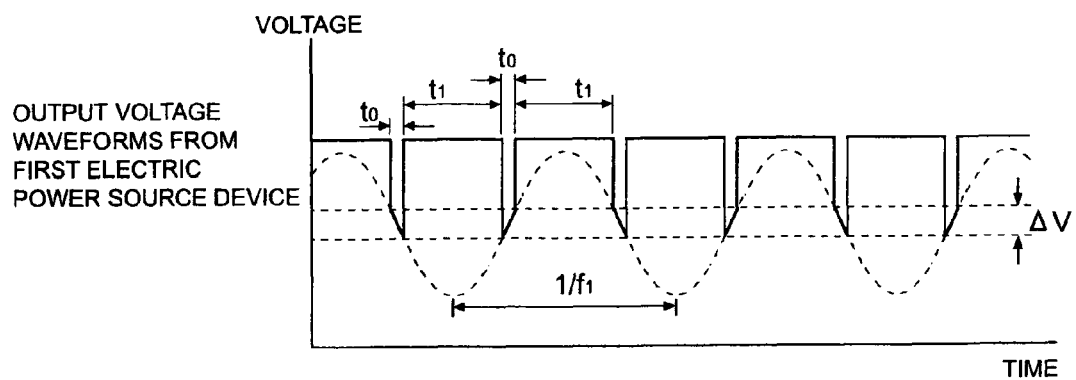
FIG. 14 shows another mode of application of voltage for controlling the self-bias voltage.

Further, the timing of applying voltage for controlling the self-bias voltage $V_{dc}$ from the first electric power source device 18 to the RF electrode 11 is not limited to a timing which includes the minimum value of the RF voltage output from the first RF electric power source 21. As shown in FIG. 14, the timing of applying voltage may be set to about the intermediate value between the maximum potential and the minimum potential, provided that the period of applying the RF voltage is set to be $½f_1$.

In this case, since the substantial frequency is $2f_1$, positive ions never follow the electrode potential of the RF electrode 11 if the relationship of $2f_1 > \omega_{pi}$ is satisfied. If the relationship of $2f_1 \leq \omega_{pi}$ is satisfied, positive ions follow the electrode potential of the RF electrode 11. The period of applying the RF voltage from the first RF electric power source device 18 may be a period of a natural number of times as long as $½f_1$. The RF electric power of the second frequency $f_2$ may be in synchronization with output from the first electric power source device 18, and may also be continuous.

The first electric power source devices 18 and 18A and the second electric power source devices 19 and 19A may have a configuration which includes an amplifier for amplifying voltage output from the first RF electric power source 21, the DC electric power source 21A and the second RF electric power source 25. The first electric power source devices 18 and 18A have a configuration which applies voltage at intervals by the operations of the first switching unit 23, but is not limited to this. They may have a configuration which makes predetermined pulse voltage waveforms by a computer or the like and amplify them to desired values. The same is applicable to the second electric power source device 19A. Further, voltage waveforms of two frequencies made and superimposed may be amplified and applied to the RF electrode 11.

The present invention is not only applied to RIE etching devices, but also may be applied to other plasma processing apparatuses such as CVD (chemical vapor deposition) apparatuses, sputtering apparatuses and ion implantation apparatuses.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A plasma processing apparatus for etching a substrate using plasma, comprising:
    a first electrode configured to mount the substrate;
    a second electrode having a ground potential and disposed to face the first electrode with a predetermined space;
    a chamber containing the first electrode and the second electrode, the chamber being capable of adjusting an inside atmosphere;
    a first electric power source device connected to the first electrode to apply a first RF voltage to the first electrode for controlling a self-bias voltage generated on the substrate, the first RF voltage having:
        a first frequency and a first period,
        a varying negative-potential waveform during a first portion of each of the first periods, and
        a ground potential value during each of the first periods other than the first portions; and
    a second electric power source device connected to the first electrode to apply a second RF voltage of a second frequency for generating plasma between the first and second electrodes, the second frequency being higher than the first frequency,
    wherein the first electric power source device includes:
        an RF electric power source to generate a signal having a periodic waveform comprising the varying negative-potential waveform, and
        a switching unit connected between the RF electric power source and the first electrode to output the signal during the first portion of the first period, the first portion being periodically repeated with a second period corresponding to a natural number of times as long as the first period; and wherein the first portion of the first period is one fourth or less of the first period.

2. The plasma processing apparatus according to claim 1, wherein the second RF voltage is continuously applied.

3. The plasma processing apparatus according to claim 1, wherein the second RF voltage is applied at intervals in synchronization with the first RF voltage.

4. The plasma processing apparatus according to claim 1, wherein the first frequency is higher than an ion frequency $\omega_{pi}$ $(=e^2 Ni/(\epsilon_0 M)^{1/2}$ [Hz], where Ni is ion density (ions/m$^3$), $\epsilon_0$ is dielectric constant of vacuum, M is mass of ion (kg), e is elementary charge of an electron) of the generated plasma.

5. The plasma processing apparatus according to claim 1, wherein a potential of the first RF voltage becomes minimum at a middle of the first portion of the first period.

* * * * *